US008310824B2

(12) United States Patent
Dunn et al.

(10) Patent No.: US 8,310,824 B2
(45) Date of Patent: Nov. 13, 2012

(54) FIELD SERVICEABLE ELECTRONIC DISPLAY

(75) Inventors: William Dunn, Alpharetta, GA (US); Ware Bedell, Cummings, GA (US); Don Le, Alpharetta, GA (US); David Williams, Canton, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 314 days.

(21) Appl. No.: 12/618,104

(22) Filed: Nov. 13, 2009

(65) Prior Publication Data

US 2011/0116231 A1   May 19, 2011

(51) Int. Cl.
*G06F 1/16* (2006.01)
(52) U.S. Cl. ......... 361/679.21; 361/679.02; 361/679.46; 361/679.58; 349/58; 349/161; 312/223.1; 312/223.2
(58) Field of Classification Search ................... None
See application file for complete search history.

(56) References Cited

U.S. PATENT DOCUMENTS

| | | | |
|---|---|---|---|
| 2,029,221 A * | 1/1936 | Burgess et al. ................ 40/574 |
| 4,007,552 A * | 2/1977 | Brooks ..................... 40/611.05 |
| 4,093,355 A | 6/1978 | Kaplit et al. |
| 4,267,657 A * | 5/1981 | Kloke ........................... 40/549 |
| 4,452,000 A * | 6/1984 | Gandy ........................... 40/574 |
| 4,547,987 A * | 10/1985 | Stilling ........................ 40/574 |
| 4,593,978 A | 6/1986 | Mourey et al. |
| 4,634,225 A | 1/1987 | Haim et al. |
| 4,817,317 A * | 4/1989 | Kovalak, Jr. .................... 40/603 |
| 4,903,423 A * | 2/1990 | Hinca ............................ 40/205 |
| 4,905,390 A * | 3/1990 | Stilling ......................... 40/549 |
| 5,029,982 A | 7/1991 | Nash |
| 5,088,806 A | 2/1992 | McCartney et al. |
| 5,247,374 A | 9/1993 | Tereda |
| 5,299,109 A * | 3/1994 | Grondal ...................... 362/241 |
| 5,559,614 A | 9/1996 | Urbish et al. |
| 5,631,805 A * | 5/1997 | Bonsall .................... 361/679.27 |
| 5,636,101 A * | 6/1997 | Bonsall et al. ........... 361/679.27 |

(Continued)

FOREIGN PATENT DOCUMENTS

JP   03153212   7/1991

(Continued)

OTHER PUBLICATIONS

Zeef, Hubing, EMC analysis of 18' LCD Monitor, Aug. 2000, 1 page.

*Primary Examiner* — Anthony Q Edwards
(74) *Attorney, Agent, or Firm* — Standley Law Group LLP

(57) ABSTRACT

An electronic display which can be serviced without having to remove the display from its mounted position. A front housing and a rear housing are hingedly attached so that the front housing can rotate and allow access to the interior of the display. An axial force mechanism can be used to aid in rotating the front housing to an open position. A locking collar, support member, or axial locking member may be used to ensure that the front housing remains open. A removable front glass assembly or removable glass panel may be used with an exemplary embodiment. The front glass assembly or glass panel can be easily replaced if it becomes damaged by minimally-trained personnel. Gutters may be used between the front and rear housing as well as the front housing and front glass assembly to ensure an adequate seal against contaminates.

20 Claims, 8 Drawing Sheets

U.S. PATENT DOCUMENTS

| | | | |
|---|---|---|---|
| 5,729,289 A | 3/1998 | Etoh | |
| 5,748,269 A | 5/1998 | Harris et al. | |
| 5,767,489 A | 6/1998 | Ferrier | |
| 5,818,010 A | 10/1998 | McCann | |
| 5,835,179 A * | 11/1998 | Yamanaka | 349/161 |
| 5,899,027 A * | 5/1999 | St. Louis | 52/63 |
| 6,089,751 A | 7/2000 | Conover et al. | |
| 6,157,432 A | 12/2000 | Helbing | |
| 6,191,839 B1 | 2/2001 | Briley | |
| 6,231,446 B1 * | 5/2001 | Majima et al. | 463/46 |
| 6,330,150 B1 * | 12/2001 | Kim | 345/87 |
| 6,417,900 B1 | 7/2002 | Shin et al. | |
| 6,494,429 B2 * | 12/2002 | Tajima | 248/473 |
| 6,535,266 B1 | 3/2003 | Nemeth et al. | |
| 6,557,284 B2 * | 5/2003 | Nolan | 40/574 |
| 6,628,355 B1 | 9/2003 | Takahara | |
| 6,758,002 B1 * | 7/2004 | Duguay | 40/603 |
| 6,839,104 B2 | 1/2005 | Taniguchi et al. | |
| 6,885,412 B2 | 4/2005 | Ohnishi et al. | |
| 6,943,768 B2 | 9/2005 | Cavanaugh et al. | |
| 6,962,528 B2 * | 11/2005 | Yokota | 463/25 |
| 6,976,330 B2 * | 12/2005 | Milliken | 40/574 |
| 7,092,248 B2 * | 8/2006 | Shu | 361/679.21 |
| 7,334,361 B2 * | 2/2008 | Schrimpf et al. | 40/452 |
| 7,339,782 B1 * | 3/2008 | Landes et al. | 361/679.27 |
| 7,513,830 B2 * | 4/2009 | Hajder et al. | 463/46 |
| 7,601,067 B2 * | 10/2009 | Anderson | 463/46 |
| 7,609,506 B2 * | 10/2009 | Aguirre | 361/679.02 |
| 7,813,124 B2 * | 10/2010 | Karppanen | 361/679.56 |
| 7,985,139 B2 * | 7/2011 | Lind et al. | 463/46 |
| 8,006,435 B2 * | 8/2011 | DeBlonk et al. | 49/366 |
| 2002/0101553 A1 | 8/2002 | Enomoto et al. | |
| 2002/0126248 A1 | 9/2002 | Yoshida | |
| 2003/0007109 A1 | 1/2003 | Park | |
| 2004/0036834 A1 | 2/2004 | Ohnishi et al. | |
| 2004/0165139 A1 | 8/2004 | Anderson et al. | |
| 2006/0218828 A1 * | 10/2006 | Schrimpf et al. | 40/452 |
| 2007/0267554 A1 | 11/2007 | Tannas | |
| 2008/0148609 A1 * | 6/2008 | Ogorevc | 40/463 |
| 2008/0236005 A1 * | 10/2008 | Isayev et al. | 40/574 |
| 2008/0276507 A1 * | 11/2008 | Hines | 40/541 |
| 2009/0241388 A1 * | 10/2009 | Dunn | 40/463 |

FOREIGN PATENT DOCUMENTS

| | | |
|---|---|---|
| JP | 08194437 | 7/1996 |
| JP | 11160727 | 6/1999 |
| JP | 2002158475 | 5/2002 |
| JP | 2005134849 | 5/2005 |
| JP | 2008046435 | 2/2008 |
| KR | 1020070070675 | 7/2007 |

* cited by examiner

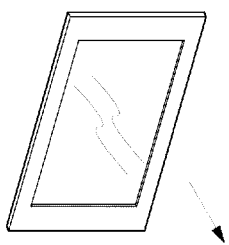
FIG-5B
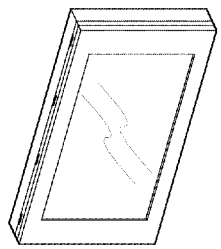
FIG-5D
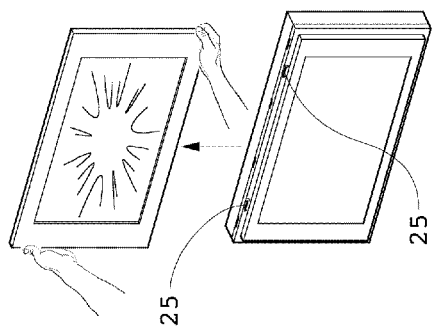
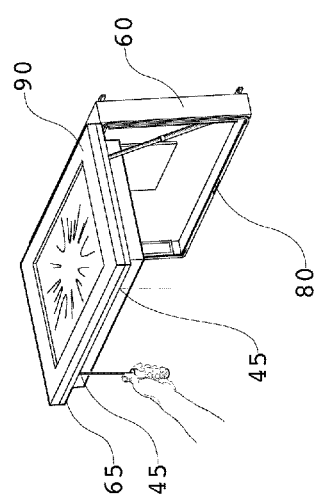
FIG-5A
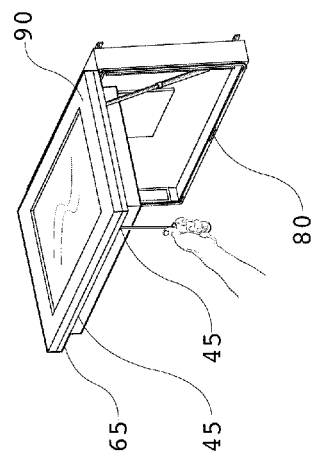
FIG-5C

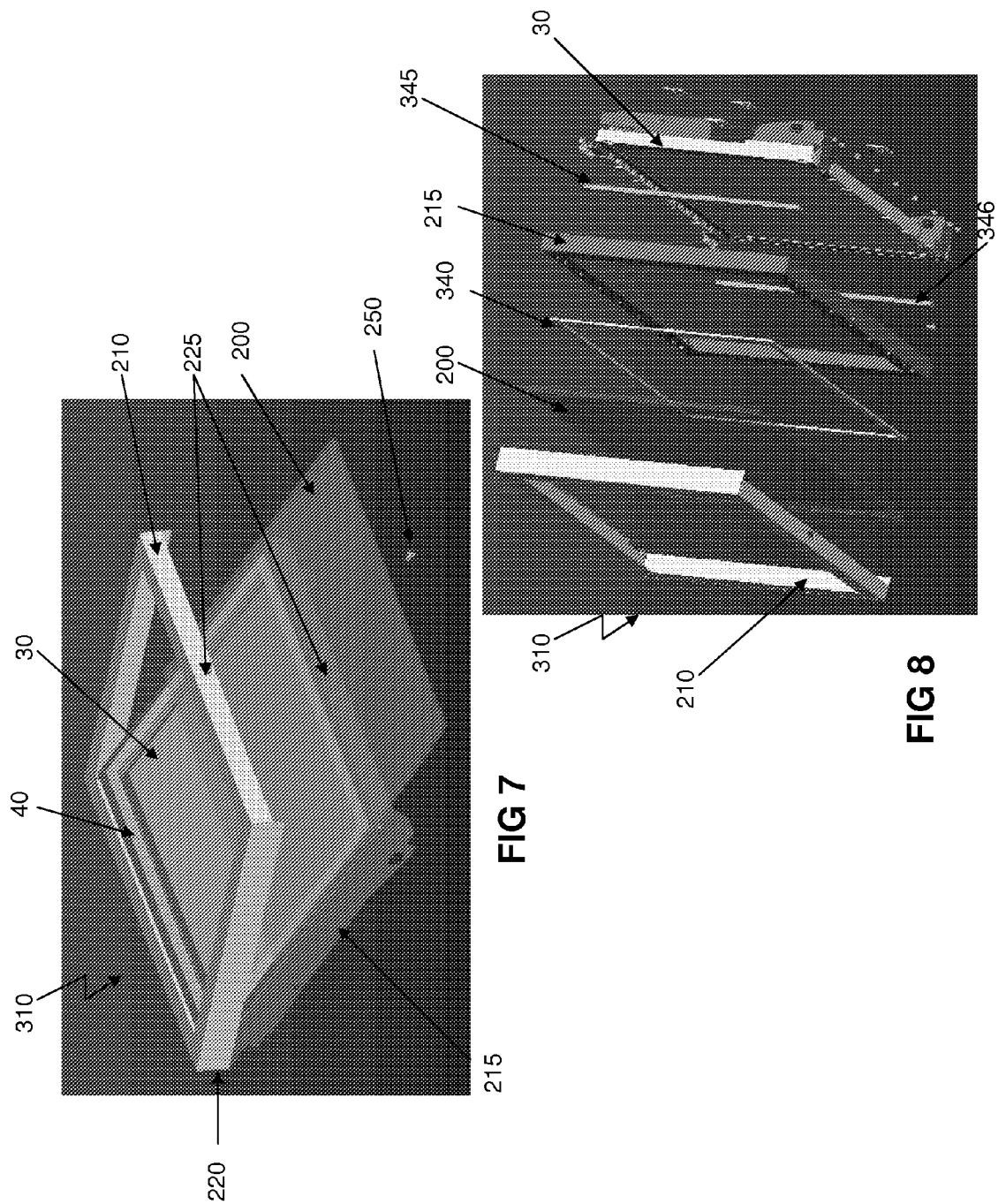

FIELD SERVICEABLE ELECTRONIC DISPLAY

CROSS-REFERENCE TO RELATED APPLICATIONS

This application is a non-provisional application and does not claim priority to any co-pending applications.

BACKGROUND OF THE INVENTIVE FIELD

The exemplary embodiments herein are directed towards an electronic display which can be serviced or repaired while remaining in a mounted position.

SUMMARY OF THE GENERAL INVENTIVE CONCEPT

Electronic displays are now being used for not only indoor entertainment purposes, but are now being utilized for indoor and outdoor advertising/informational purposes. For example, liquid crystal displays (LCDs), plasma displays, light emitting diode (LED), electroluminescence, light-emitting polymers, organic light emitting diode displays (OLEDs) and many other flat panel displays can now be used to display information and advertising materials to consumers in locations outside of their own home or within airports, arenas, transit stations, stadiums, restaurants/bars, gas station pumps, billboards, and even moving displays on the tops of automobiles or on the sides of trucks.

The rapid development of flat panel displays has allowed users to mount these displays in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays. Displays which can provide these features typically contain a number of advanced electronic assemblies, which over time, can fail or degrade in performance. Once these displays are mounted in the user's desired position, replacing any failed electronic assemblies can be a costly and time-consuming process. Typically, the display must be removed from its mounted position so that it can be serviced. Removing the display can be very expensive and time consuming, especially in highly trafficked and difficult-to-access areas. Further, replacement of certain parts may require a 'clean room' environment.

Typically, the replacement of many electronic assemblies requires access to the rear of the display, which is often used as the mounting surface for the display (thus limiting access to the rear of the display). In many applications, electronic displays may be mounted side-by-side in an array, where access to the right or left (or both) sides of the display is also limited. Further, in some applications a display may be mounted near overhead obstacles such as lights, ceilings, and overhangs where access to the top of the display is also limited. Further, in some applications a pair of displays may be mounted back-to-back so that access to the rear of the display is limited due to the presence of the other display.

Exemplary embodiments include electronic displays which provide access to the rear of the display through the bottom of the display housing. Embodiments may fasten the components of the image assembly to a front housing which may rotate to allow access to the components of the display. Thus, embodiments which use this arrangement may be mounted directly below, and/or directly to the right or left of obstacles and still allow access to various components for servicing or replacement.

Further, some embodiments may contain a front glass assembly that can be replaced if it becomes damaged. The front glass assembly may be attached to the housing a minimal number of fastening means so that the front glass assembly can be quickly changed by minimally-trained personnel. A gutter may surround the interface between the front glass assembly and the housing to ensure that contaminates cannot enter the housing. The gutter may be sealed with a sealing material, for example a gasket.

An exemplary display can be serviced quickly, by minimally-trained personnel while the display remains in its mounted position. The end user may even service the display themselves. Especially in advertising, when displays are inoperable or malfunctioning, valuable advertising revenue can be lost. By reducing the amount of time required to access a display, any interruption of traffic (both human, auto, and rail) may be minimized.

The exemplary embodiments herein are not intended to be exhaustive or to unnecessarily limit the scope of the embodiments. The exemplary embodiments were chosen and described in order to explain the principles so that others skilled in the art may practice the embodiments. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIGS. 5A-5D provide an illustration of one method for the in-field replacement of the front glass assembly;

FIG. 7 provides a perspective illustration of a front glass being removed from an exemplary front housing;

FIG. 8 provides an exploded perspective view of another embodiment of a front housing.

DETAILED DESCRIPTION OF EXEMPLARY EMBODIMENT(S)

Figure 1:
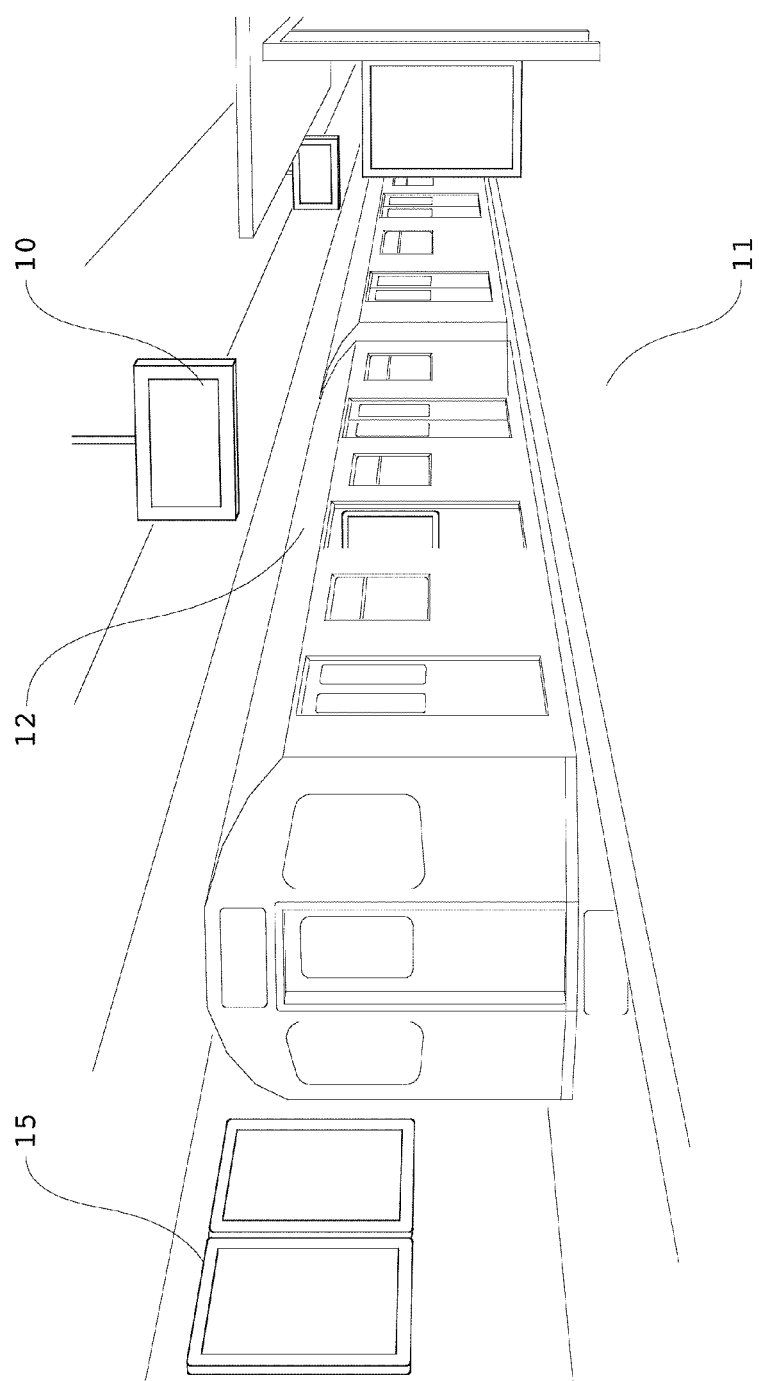
FIG. 1 provides an illustration of various mounting positions for electronic displays.

FIG. 1 provides an illustration of several possible placement positions for modern electronic displays. The particular illustration shown in this figure is a transit station (ex. light rails, subways, passenger trains). Display 10 is mounted above the platform 11 and adjacent to the train 12. As can be readily appreciated, display 10 is located in a highly-trafficked area so that its visibility to consumers remains high. However, to remove the display 10 from its mounted position in order to service the display 10 would result in a lengthy disruption of the human traffic below. This disruption would be repeated when the display 10 is again remounted (or replaced). Some displays can be very heavy (150-400 lbs for example) and can be very difficult to remove from their mounting and/or re-mount. Further, the lengthy downtime while the display 10 is being repaired/replaced would result in a loss of valuable advertising revenue. Alternatively, if the display 10 is being used for informational purposes (i.e. departure/arrival times, weather/travel advisories, etc.) a lengthy downtime will delay the transmission of this valuable information to users.

An array of displays 15 is also shown in FIG. 1. The displays 15 are placed adjacent to one another and in close proximity to the train 12. Obviously, there is a small window of opportunity to access displays 15 because access is only possible between train stops.

Figure 2:
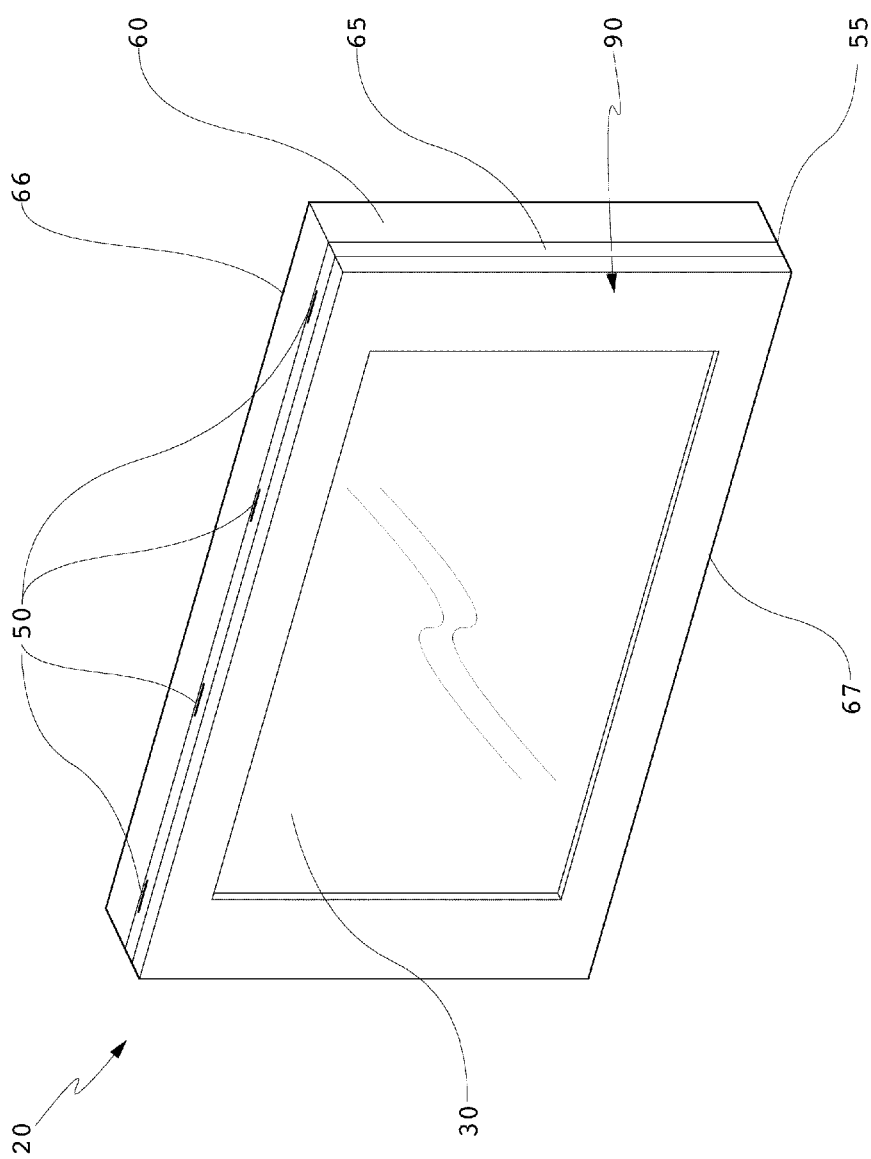
FIG. 2 provides a perspective view of an exemplary display when the front housing is closed.

FIG. 2 provides an exemplary display 20 which is oriented in a landscape manner. It should be noted that the embodiments taught herein may be used with displays in both landscape orientation (similar to display 10 in FIG. 1) and portrait orientation (similar to displays 15 in FIG. 1). The image assembly 30 (sometimes known as the 'display stack') is contained within a housing 55, which is divided into a front housing 65 and rear housing 60. The front and rear housings 65 and 60 may be attached along the top edge 66 and bottom edge 67 of the housing 55. Along the top edge 66, one or more hinging mechanisms 50 may be used to hingedly attach the front housing 65 to the rear housing 60. Along the bottom edge 67, one or more locking or latching mechanisms 80 (shown in FIG. 3) may be used to removably attach the bottom edge of the front housing 65 to the bottom edge of the rear housing 60. An exemplary locking or latching mechanism would prevent unauthorized users from opening the display. Thus, it would preferably require a unique access instrument such as a key, RFID, or a special mechanical tool in order to release.

Figure 3:
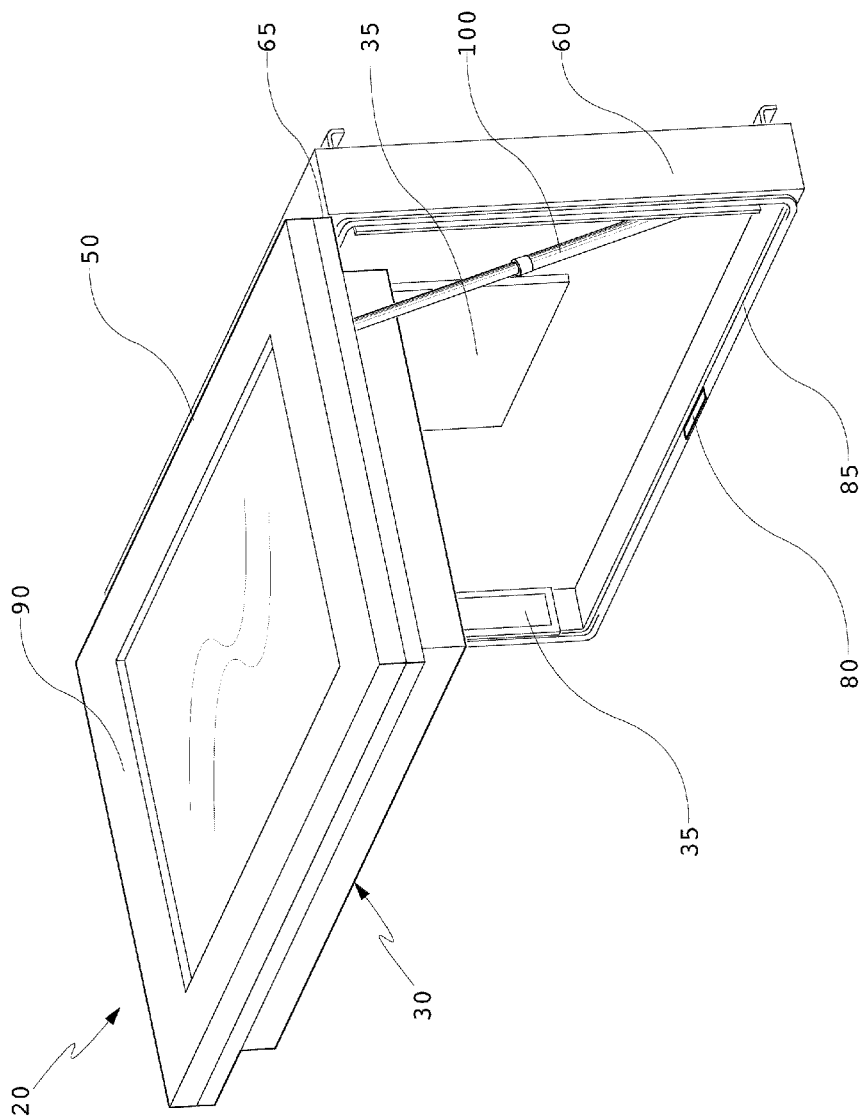
FIG. 3 provides a perspective view of an exemplary display when the front housing is opened.

FIG. 3 shows an exemplary display 20 where the front housing 65 has been unlatched from latching mechanism 80 and hinged about the hinging mechanism 50 into the 'open position'. An optional axial force mechanism 100 provides an upward force to both rotate the front housing 65 about the hinging mechanism 50 as well as hold the front housing 65 in the open position. An axial force mechanism 100 may or may not be necessary depending on the size of the display. An exemplary axial force mechanism might be a compression spring or more preferably a gas spring. A locking collar or other locking device may be used to ensure that the axial force mechanism 100 does not release and allow the front housing 65 to close. Alternatively, a support member may be used which does not axially extend, but may be placed once the front housing is in an 'open' position (similar to a common support member used to hold the hood of an automobile open).

A sealing material 85 may be placed between the surfaces and edges where the front and rear housings 65 and 60 meet. A gasket may be used as an exemplary sealing material. An overlap between the edges may be used to help prevent contaminates from entering the housing 55. This overlap is sometimes referred to as a 'gutter' and is discussed further in FIG. 4.

As can be observed from FIG. 3, once the front housing 65 is in the open position, the rear portion of the image assembly 30 can be accessed, as well as a plurality of other electronic assemblies 35 which may be stored in the rear housing 60. The various electronic assemblies 35 may include, but are not limited to: power supplies, video cards, wireless network devices, Ethernet ports, cooling devices, LAN devices, timing and control devices (TCON), fans, backlights, and various portions of the image assembly 30 (or the entire image assembly 30). The image assembly 30 will vary depending on the type of display being used. For example, if an LCD display is being used the image assembly will typically comprise several layers including: a backlight, front and rear polarizers, liquid crystal material sandwiched between two transparent plates, an electrically-conductive layer, and possibly additional polarizing/anti-reflective layers. An OLED display on the other hand, may comprise: a cathode, emissive layer, conductive layer, and an anode. As mentioned above, embodiments can be practiced with any type of flat panel display, including but not limited to: LCD, OLED, plasma, light emitting polymer (LEP) and organic electro luminescence (OEL) displays.

In addition to facilitating access to the various electronic assemblies 35 and the image assembly 30, an exemplary embodiment also contains a removable exterior front glass assembly 90 which is removably attached to the front housing 65.

Figure 4:
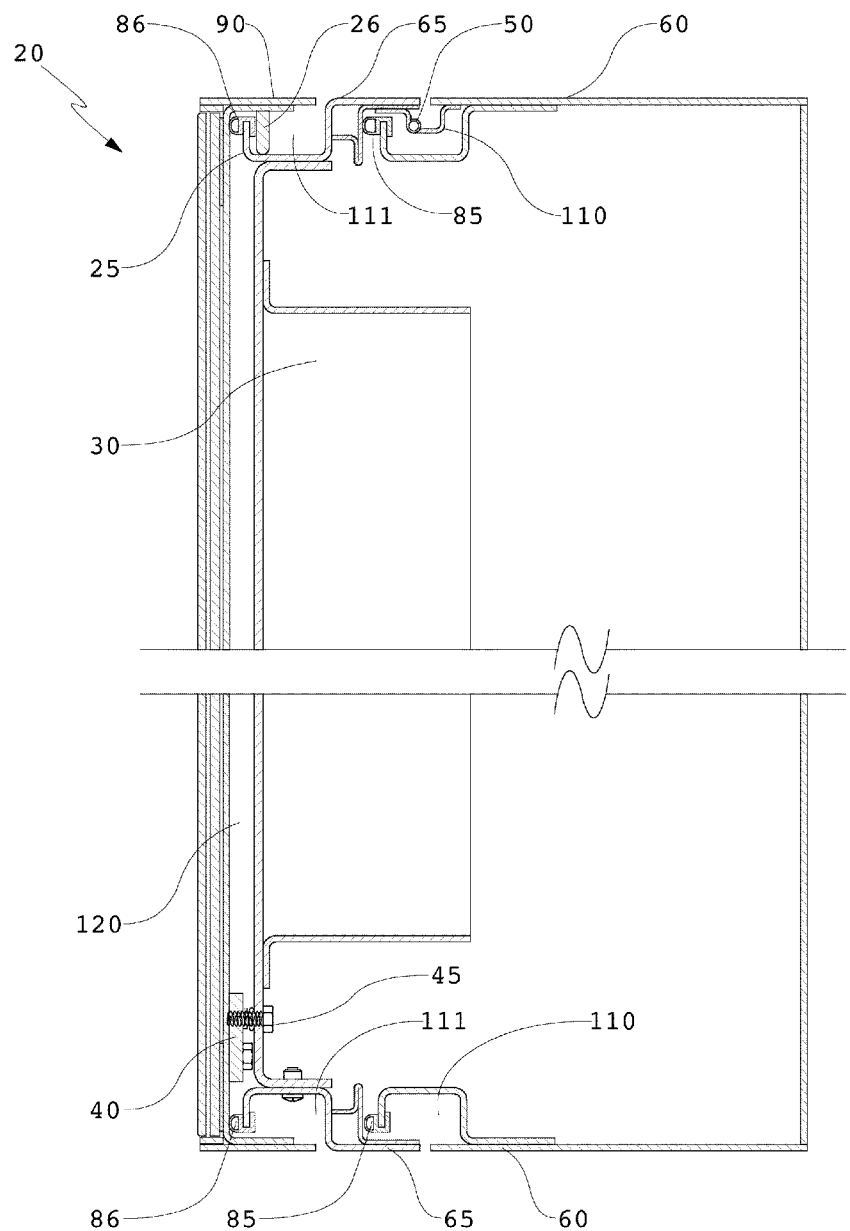
FIG. 4 provides a sectional view of an exemplary display when the front housing is closed.

FIG. 4 shows a sectional view of an exemplary display 20 when the front housing 65 is closed. This section is taken along a plane that is parallel to the line of sight of an observer. The rear housing 60 and front housing 65 are hingedly attached through the hinging mechanism 50. An optional first gutter 110 encircles the display 20 where the rear housing 60 and front housing 65 meet. The first gutter 110 has a portion defined by the front housing 65 and another portion defined by the rear housing 60. The housings overlap each other and at the overlap there may be a sealing material 85.

The front housing 65 may contain one or more hangers 25 which interact with one or more tabs 26 near the top of the front glass assembly 90. The front glass assembly 90 may also contain an attachment plate 40 where a fastening means 45 may be used with the attachment plate 40 to attach the front glass assembly 90 to the front housing 65. In an exemplary embodiment, the attachment plate 40 may contain a female threaded hole and the fastening means 45 may be a male threaded member which interacts with the threaded hole to draw the front housing 65 and front glass assembly 90 together. Also, in an exemplary embodiment the male threaded member would be held captive so that once it is retracted from the attachment plate 40 it would not fall and possibly become lost. Of course, the fastening means 45 can be any other mechanical means for attaching two elements together. Other embodiments may provide a threaded post on the attachment plate 40 where the threaded post passes through the front housing 65 and a nut may be tightened onto the post in order to draw the front housing 65 and front glass assembly 90 together. Other embodiments may use locking pins or snap connectors. The attachment plate 40 may be a separate piece that is attached to the frame or there may be an attachment plate integrated into the frame itself. In some embodiments, the hangers and tabs may not be used to attach the top of the front glass assembly 90 to the top of the front housing 65. In these embodiments, simple mechanical fasteners or the attachment plate and fastening means may be used.

An optional second gutter 111 encircles the display 20 where the front housing 65 and front glass assembly 90 meet.

The second gutter 111 has a portion defined by the front housing 65 and another portion defined by the front glass assembly 90. The front housing 65 and front glass assembly 90 overlap each other and at the overlap there may be a sealing material 86. When the front glass assembly 90 is attached to the front housing 65 there may be a sealed channel 120 between the front glass assembly 90 and the image assembly 30. The channel 120 may be used as insulation between the cover glass and the image assembly 30 to prevent heat from transferring from the exterior glass to the image assembly 30. This can be useful in situations where the display 20 is placed in sunlight and may be subject to solar loading (heat buildup on the cover glass and/or image assembly due to radiative heat transfer from the rays of the sun). Still further, the channel 120 may provide a portion of a closed or open cooling loop which forces cooling gas through the channel 120 in order to cool the image assembly 30. One or more fans may be used to force air through the channel 120. Examples of exemplary closed cooling loops for electronic displays can be found at least in co-pending application Ser. Nos. 12/234,307 filed on Sep. 19, 2008; 12/237,365 filed on Sep. 24, 2008; and 61/138,736 filed on Dec. 18, 2008, each application herein incorporated by reference in their entirety. Of course, these closed loops can also be used to heat the image assembly 30 when the display 20 is placed in cold environments.

The components of the front glass assembly 90 may vary depending on the particular application. In most applications, the front glass assembly 90 will contain at least one pane of glass. In an exemplary assembly, there may be two panes of glass which are laminated together using index-matched optical adhesives. A frame may be used to surround the glass panes and provide attachment points such as the tabs 26 and the attachment plate 40. An exemplary frame may be formed from sheet metal, but could also be cast and/or machined or injection molded. Plastic or composite materials could also be used.

FIGS. 5A-5D provide an illustration of one method for the in-field replacement of the front glass assembly 90. In FIG. 5A, the latching mechanism 80 is released and the front housing 65 is opened to allow access to the interior of the display. The rear housing 60 remains in its mounted position. One or more fastening means 45 may be removed from the display to release the bottom of the front glass assembly 90 from the front housing 65. The top of the front glass assembly 90 however remains attached through one or more hangers 25.

In FIG. 5B, the front housing 65 is closed and the damaged front glass assembly is removed by lifting up off the hangers 25. A replacement front glass assembly is then placed on the hangers 25. In FIG. 5C, the front housing 65 is opened again to allow access to the interior of the display. One or more fastening means 45 may then be inserted to attach the bottom of the front glass assembly 90 from the front housing 65. In FIG. 5D, the front housing 65 is closed and the latching mechanism 80 attaches the bottom portions of the front and rear housings 65 and 60.

In the embodiments shown above, the front glass assembly 90 may be removed from the display assembly. Also discussed above, the front glass assembly 90 can have several components including the front glass panel(s), a surrounding frame, and various attachment means. In another embodiment, the front glass panel itself (one or more panes of glass or other transparent material) may be removed without removing/replacing the surrounding frame and/or attachment means.

Figure 6A:
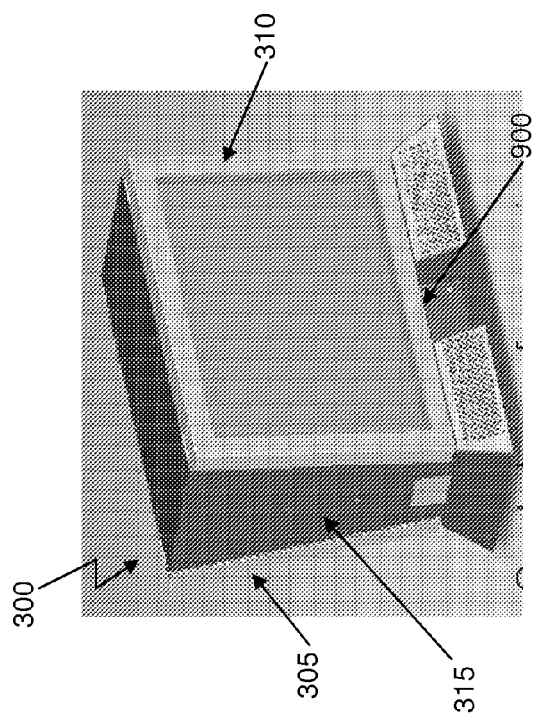
FIG. 6A provides a perspective view of another embodiment, showing an exemplary dual-display back-to-back assembly where the front housings are closed.
Figure 6B:
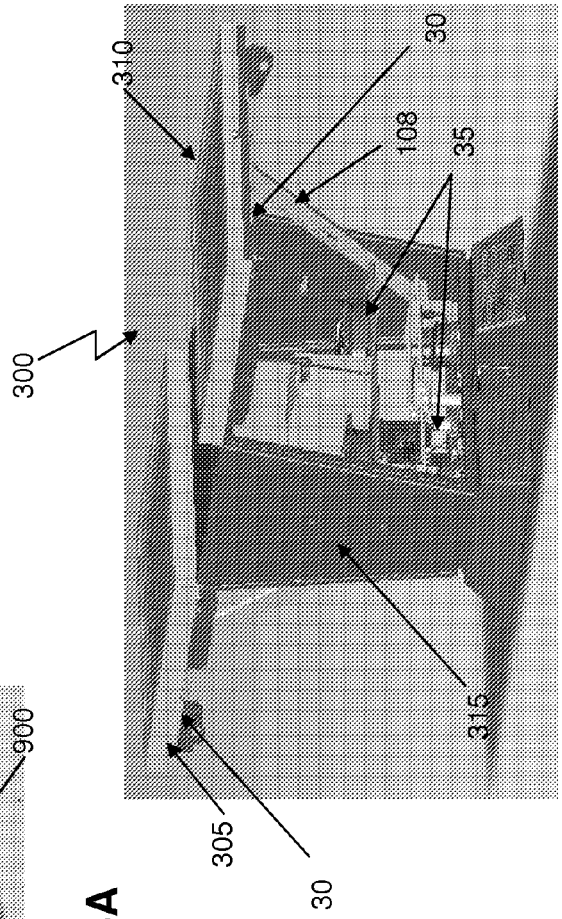
FIG. 6B provides a perspective view of the embodiment from FIG. 6A where the front housings are opened.

FIGS. 6A and 6B illustrate a second embodiment of a display assembly 300 where two front housings 305 and 310 are placed in a back-to-back orientation while sharing a single rear housing 315. The two front housings 305 and 310 may be hingedly fastened to the rear housing 315 so that they may rotate into an open position and provide access to the interior of the display assembly 300. FIG. 6A shows a 'closed' position while FIG. 6B shows an 'open' position. A latching or locking mechanism 900 may be located on the bottom edge of the front housings 305 and 310 to allow the bottom portion to release and swing open. An exemplary latching or locking mechanism would prevent unauthorized users from opening the display. Thus, it would preferably require a unique access instrument such as a key, RFID, or a special mechanical tool in order to release.

As shown in FIG. 6B, when the front housings 305 and 310 are in the 'open' position, various electronic assemblies 35 can be accessed for repair or replacement. An image assembly 30 may be attached to each of the front housings 305 and 310 and can be accessed when the housings are in an 'open' position. An axial-locking mechanism 108 may be used to ensure that the front housings remain in an 'open' position. An exemplary axial-locking mechanism 108 would be capable of axial extension until a pre-determined point where it would then lock in place until the user desires to close the assembly and release the axial-locking mechanism 108. This may be used to ensure that the assembly remains in an 'open' position while it is being serviced. Alternatively, an axial force mechanism (such as a spring or gas spring) may be used. Still alternatively, a support member may be used which does not axially extend, but may be placed once the front housing is in an 'open' position (similar to a common support member used to hold the hood of an automobile open).

FIG. 7 provides a perspective illustration of a glass panel 200 being removed from a front housing 310. Although called a 'glass' panel, the panel does not have to be made of glass. Various transparent plastics or composite materials may also be used to produce the glass panel 200. However, in an exemplary embodiment the glass panel 200 would be made of glass and even more preferably would be made of two or more plates of glass which are laminated together with optical adhesive.

In this embodiment, the front housing 310 may comprise a front glass frame 210 which may be removably attached to a door frame 215. The front glass frame 210 and the door frame 215 may be removably attached in a number of different ways including but not limited to: mechanical fasteners, snap fit, tabs, hinges, locking channels, or any combination of these. In an exemplary embodiment, the front glass frame 210 may be hingedly attached to the door frame 215 at the top edge 220 and may attach with a mechanical fastener 250 at the bottom edge 225. The front glass frame 210 may simply overlap the door frame 215 at the top edge 220 or there may be a hinge at the top edge 220. These could also be reversed where the hinge or overlap occurs at the bottom edge 225 and a fastener is used at the top edge 220. Alternatively, fasteners could be used at both the bottom and top edges 225 and 220. In some embodiments, the mechanical fastener at the bottom edge 225 may be accessed without having to open the front housings (i.e. without having to unlock the latching or locking mechanism 900).

It has been discovered that a typical glass panel 200 is subject to damage from vandalism or accidental breakage and it can be very costly to send personnel in order to replace. However, using an exemplary embodiment, the glass panel 200 can be easily removed and replaced by minimally trained personnel. Thus, a new glass panel 200 with assembly instructions can be shipped to the end user who may replace the glass themselves. An exemplary design allows for the in-field replacement of the glass panel, so that the display assembly does not have to be removed from its mounted position in order to be serviced. The ability to allow the end-user to replace the glass along with servicing the display in its mounted position saves both time and money, both of which are especially important with advertising displays.

FIG. 8 provides an exploded perspective view of a front housing 310. A gasket (or other sealing material) 340 may be placed between the glass panel 200 and the door frame 215. Optionally, another gasket (not shown) may be placed between the front glass frame 210 and the glass panel 200. Another gasket may be used between the door frame 215 and the image assembly 30. In an exemplary embodiment, this gasket would comprise two gasket strips 45 and 46 which would provide a seal along two opposing edges of the image assembly 30 and the door frame 215. This technique could be used to define a channel (see channel 550 in FIG. 9) which has an inlet and exit with the front surface defined by the glass panel 200 and the rear surface defined by the image assembly 30.

Figure 9:
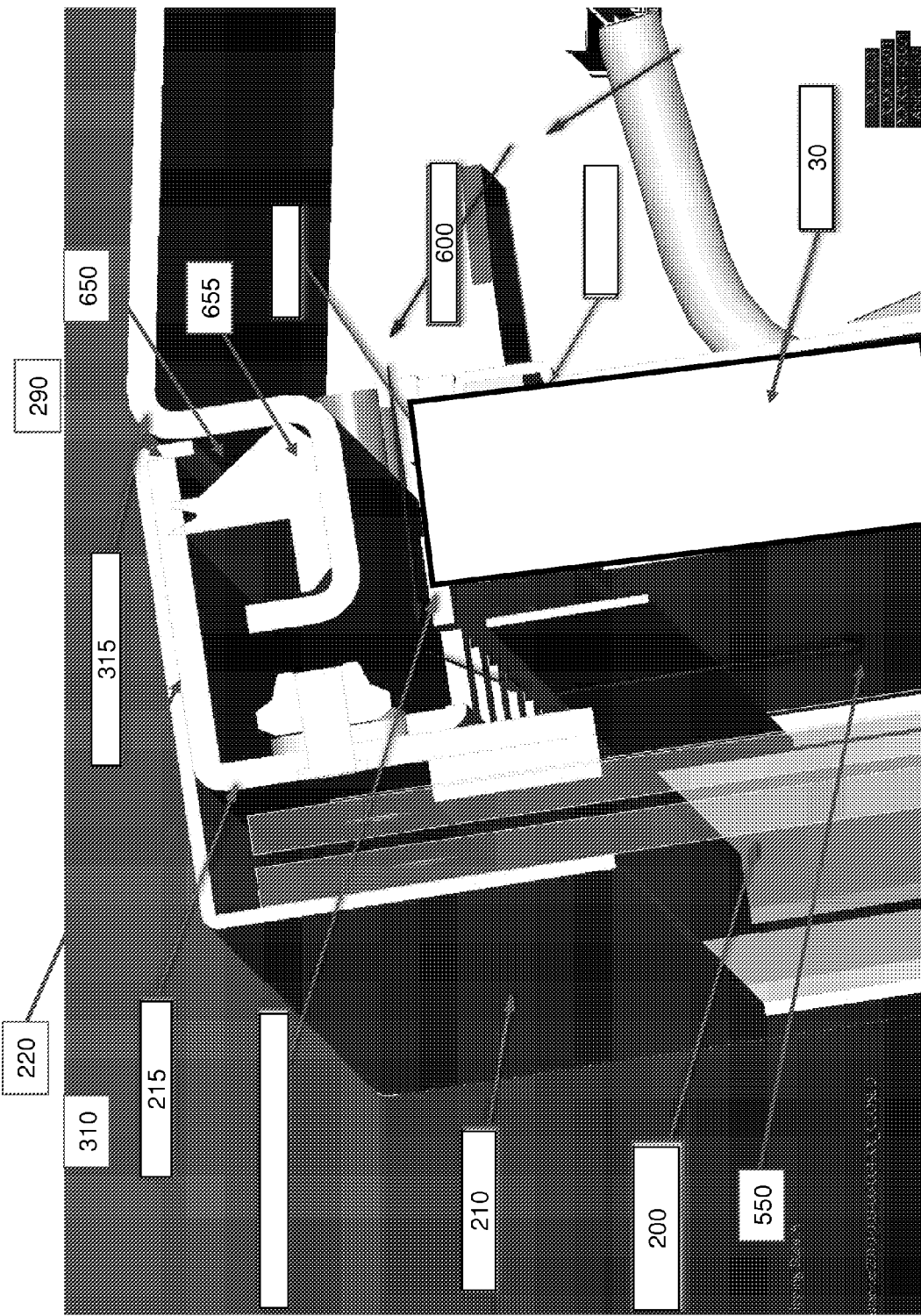
FIG. 9 provides a perspective sectional view of the top portion of one embodiment for the interface between the front glass frame and the door frame.

FIG. 9 provides a perspective sectional view of the top portion of one embodiment for the interface between the front glass frame 210 and the door frame 215. In this embodiment, the top edge 220 of the front glass frame 210 overlaps the door frame 215. The front glass frame 210 may contain a tab 290 which holds the front glass frame 210 in place against the door frame 215. Once the bottom edge of the front glass frame 210 has been released, the tab 290 can act as a hinge and allow the front glass frame 210 to rotate relative to the door frame 215 (as shown in FIG. 7). Alternatively, an actual hinge or mechanical fasteners could also be used. Again, the bottom edge of the front glass frame 210 can be attached in many ways including but not limited to: mechanical fastener, latching mechanism, snap fit, tabs, locking channels, or any combination of these.

A gutter 650 may be used to prevent water and contaminates from entering the display. The gutter 650 may be defined as a substantially closed channel having overlapping portions of the front housing 310 and rear housing 315. The rear housing 315 may provide a bottom surface which may be used to collect water and prevent it from entering the display. A gasket (or other sealing material) 655 may be used to further seal the interface between the front and rear housings 310 and 315. A hinging mechanism (not shown) may also be provided within the gutter 650 (similar to hinging mechanism 50 in FIG. 4).

The space between the glass panel 200 and the image assembly may be used to define a channel 550. The channel may be used as insulation between the glass panel 200 and the image assembly 30 to prevent heat from transferring from the glass panel 200 to the image assembly 30. This can be useful in situations where the display is placed in sunlight and may be subject to solar loading (heat buildup on the glass panel and/or image assembly due to radiative heat transfer from the rays of the sun). Still further, the channel 550 may provide a portion of a closed or open cooling loop which forces cooling gas 600 through the channel 550 in order to cool the image assembly 30. One or more fans may be used to force air through the channel 550. Examples of exemplary closed cooling loops for electronic displays can be found at least in co-pending application Ser. Nos. 12/234,307 filed on Sep. 19, 2008; 12/237,365 filed on Sep. 24, 2008; and 61/138,736 filed on Dec. 18, 2008, each application herein incorporated by reference in their entirety. Of course, these closed loops can also be used to heat the image assembly 30 when the display is placed in cold environments.

With the exemplary embodiments herein, an electronic display can remain in its mounted position while the interior of the display can be accessed and various electronic components can be repaired or replaced. Further, by using the removable front glass assembly or removable glass panel designs, anyone with basic mechanical skills can easily replace a damaged front glass assembly with a new one. Thus, processes which previously had to be performed by specially-trained personnel can now be performed by minimally-trained personnel, even in the field. Further, the expensive, large, and sometimes very heavy electronic displays do not have to be removed from their mounted position in order to be serviced. This can save a lot of time and money when maintaining a fleet of electronic displays.

While certain embodiments of the present invention are described in detail above, the scope of the invention is not to be considered limited by such disclosure, and modifications are possible without departing from the spirit of the invention as evidenced by the following claims:

What is claimed is:

1. An in-field serviceable electronic display comprising:
   a rear housing having first and second opposing edges;
   a front housing hingedly attached to the first edge of the rear housing;
   an image assembly attached to the front housing;
   a latching mechanism which fastens the front housing to the second edge of the rear housing;
   a front glass assembly having a frame surrounding a pane of glass;
   a vertical hanger at the top of the front housing having a front side and a rear side;
   a vertical tab on the frame of the front glass assembly which is adapted to fit against the rear side of the hanger on the front housing; and
   a means for removably attaching the bottom of the front glass assembly to the bottom of the front housing.

2. The electronic display of claim 1 further comprising:
   an axial force mechanism having one end attached to the front housing and the opposing end attached to the rear housing.

3. The electronic display of claim 1 further comprising:
   a gutter at the interface of the front and rear housings.

4. The electronic display of claim 3 wherein:
   the gutter is defined by a substantially closed channel with sidewalls containing overlapped portions of the front and rear housings.

5. The electronic display of claim 4 further comprising:
   a sealing material placed between the overlapping portions of the front and rear housings.

6. The electronic display of claim 1 further comprising:
   a support member having one end attached to the front housing and the opposing end attached to the rear housing.

7. The electronic display of claim 1 wherein:
   the image assembly is an LCD.

8. The electronic display of claim 1 wherein:
   the image assembly is an OLED display.

9. An in-field serviceable electronic display comprising:
   a rear housing having first and second opposing edges;
   a front housing hingedly attached to the first edge of the rear housing;
   an image assembly attached to the front housing; and
   a latching mechanism which fastens the front housing to the second edge of the rear housing;
   a substantially closed channel having a portion defined by the front housing and another portion defined by the rear housing where the two portions overlap each other;

a gas spring having one end attached to the front housing and the opposing end attached to the rear housing;
a hanger at the to of the front housing;
a removable front glass assembly attached to the hanger on the front housing and having a frame; and
a substantially closed channel having a portion defined by the front housing and another portion defined by the frame of the front glass assembly where the two portions overlap each other.

10. The electronic display of claim 9 further comprising:
a locking collar attached to the gas spring.

11. The electronic display of claim 9 further comprising:
a channel between the pane of glass in the front glass assembly and the image assembly; and
a fan which draws air through the channel.

12. The electronic display of claim 9 wherein:
the image assembly is an LCD.

13. An in-field serviceable electronic display comprising:
a rear housing having first and second opposing edges;
a front housing hingedly attached to the first edge of the rear housing;
an image assembly attached to the front housing; and
a latching mechanism which fastens the front housing to the second edge of the rear housing;
a support member having one end attached to the front housing and the opposing end attached to the rear housing;
a vertical hanger at the top of the front housing; and
a removable front glass assembly attached to the hanger on the front housing and having
two panes of glass laminated together with optical adhesive;
a frame surrounding the panes of glass,
a vertical tab at the top of the frame and adapted to hold the front glass assembly in place when slipped over the hanger on the front housing, and
a means for removably attaching the bottom of the frame to the bottom of the front housing.

14. The electronic display of claim 13 further comprising:
a channel between the panes of glass in the front glass assembly and the image assembly; and
a fan which draws air through the channel.

15. The electronic display from claim 14 further comprising:
a substantially closed channel encircling the display and having a portion defined by the front housing and another portion defined by the rear housing where the two portions overlap each other.

16. An in-field serviceable electronic display comprising:
a rear housing having first and second opposing edges;
a front housing hingedly attached to the first edge of the rear housing;
an image assembly attached to the front housing;
a vertical hanger at the top of the front housing;
a front glass assembly having a frame surrounding a pane of glass;
a vertical tab on the frame of the front glass assembly which is adapted to support the weight of the front glass assembly when slipped over the hanger on the front housing; and
a fastener attaching the front glass assembly to the front housing and accessible when the front housing is hinged away from the rear housing.

17. The electronic display of claim 16 further comprising:
an axial force mechanism having one end attached to the front housing and the opposing end attached to the rear housing.

18. The electronic display of claim 16 further comprising:
a gasket positioned between the front and rear housings.

19. The electronic display of claim 16 wherein:
the image assembly is an LCD.

20. The electronic display of claim 16 wherein:
the image assembly is an OLED.

* * * * *